US006769107B1

(12) United States Patent
Watkins (10) Patent No.: US 6,769,107 B1
(45) Date of Patent: Jul. 27, 2004

(54) METHOD AND SYSTEM FOR IMPLEMENTING INCREMENTAL CHANGE TO CIRCUIT DESIGN

(75) Inventor: Daniel R. Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 150 days.

(21) Appl. No.: 10/005,062

(22) Filed: Dec. 3, 2001

(51) Int. Cl.[7] .......................................... G06F 17/5035
(52) U.S. Cl. .............................. 716/16; 716/2; 716/18
(58) Field of Search ............................. 716/1, 2, 3, 4, 716/5, 7, 16, 17, 18

(56) References Cited

U.S. PATENT DOCUMENTS

| 5,867,396 | A | * | 2/1999 | Parlour .......................... 716/18 |
| 6,093,214 | A | * | 7/2000 | Dillon ............................ 716/17 |
| 6,134,705 | A | * | 10/2000 | Pedersen et al. ............... 716/18 |
| 6,434,735 | B1 | * | 8/2002 | Watkins ........................ 716/16 |
| 6,519,754 | B1 | * | 2/2003 | McElvain et al. ............. 716/18 |
| 6,530,073 | B2 | * | 3/2003 | Morgan ........................ 716/18 |

* cited by examiner

Primary Examiner—Leigh M. Garbowski
(74) Attorney, Agent, or Firm—Thelen Reid & Priest (57) ABSTRACT

A method implements a change to a circuit design for a system formed on a semiconductor chip, the circuit design including at least one circuit core. The method includes providing in the circuit design at least one field programmable gate array (FPGA) core, extracting an incremental change to the circuit design by comparing a new resister-transfer-level (RTL) design and an old RTL design for the system, synthesizing the incremental change into a netlist for the at least one FPGA core, generating new metal layer interconnections so as to provide an input and an output for the at least one FPGA core in accordance with the incremental change, and programming the at least one FPGA core in accordance with the netlist. The at least one FPGA core is provided in an otherwise unused area of the chip.

35 Claims, 8 Drawing Sheets

METHOD AND SYSTEM FOR IMPLEMENTING INCREMENTAL CHANGE TO CIRCUIT DESIGN

FIELD OF THE INVENTION

The present invention relates to application specific integrated circuit (ASIC) designs. More particularly, the present invention relates to method and system for implementing an incremental change to an existing circuit design.

BACKGROUND OF THE INVENTION

When an existing ASIC design needs fixes and/or upgrades, such fixes and/or upgrades are typically implemented in the resistor-transfer-level (RTL) design and re-synthesized into a new netlist. That is, a high-level circuit description is converted (synthesized) into a list of logic gates and their interconnections (netlist). Then, a new layout is created based on the new RTL floor planning, a new mask set is built in accordance with the new layout, and finally the new revision of ASIC design is manufactured in a foundry (or "fab"). However, this re-designing process is costly, as a new mask set can be cost more than $100,000. This is also time-consuming, since a new run through a new layout and fabrication thereof can take three months.

A "focused ion beam (FIB)" approach is also available to make changes to an existing ASIC design. The FIB technique cuts metal layers at the top levels and makes edits. Although FIBs are quick, changes can be made by FIBs are limited, expensive, and typically unreliable. Thus, FIB approach is best suited to "trying out a fix" situations before committing to production of a silicon substrate with a new layout.

The "backfill gate" approach is established in a recent generation of ASIC technology, for example, cell-based "system-on-a chip (SOC)" solutions where a multiple circuit cell (or multiple circuit core) system is formed on a single chip. In this approach, units are disposed or "sprinkled" in unused gaps between cells/cores in a standard cell layout. A "unit" typically includes 2–4 transistors, and logic gates can be made from such units. The die size does not change by disposing additional units. Since such units are "free," i.e., not used in the standard circuit design, they can be programmed to be certain kinds of gates (backfill gates) so as to add or change certain functions of the standard/existing circuit design. Thus, after an ASIC is built, if there is a need for a small change (or fix) to the netlist, the backfill gates can be used to implement the change. Since the backfill gates are interconnected at the metal layers, the fix can be done with only changes at the metal layers. ASIC design tools can be used for programming the backfill gates and creating new interconnections. Thus, the implementation of a new ASIC design can be done through a fast (typically a week) and inexpensive metalization process in a foundry.

A typical unit size is 9.45 micron meter ($\mu$m) tall by 3.15 $\mu$m wide in a current process technology with drawn gate length of 0.18 $\mu$m (effective gate length of 0.13 $\mu$m). There are typically tens of thousands of multi-unit sites on a system-on-a-chip (SOC) design with a multi-million gate layout. The units can be programmed at the metal layer level to be many kinds of logic gates, such as INV, FDI, AOI, etc. Up to 30 different cells are supported by these backfill gates.

However, since the backfill gate approach utilizes changes to the gate structure, editing (change to the circuit design) is done at the netist gate level. Such gate-level change is tedious, and typically constrained to small changes, such as less than a hundred gates. In addition, functions implemented is limited to definition at the gate level, and thus typically complex functions cannot be implemented. Furthermore, the implemented backfill gates typically use multi-unit sites, i.e., contiguous unit sites. Since such multi-unit sites can be significantly distributed over the free area or gap of circuit cell/core design, implementing a number of backfill gates would cause congestion to the cell/core layout.

Accordingly, it would be desirable to provide a method and system for implementing an incremental change and/or sufficient functionality to an exiting ASIC design without causing layout congestion in a cost effective and speedy manner.

BRIEF DESCRIPTION OF THE INVENTION

A method implements a change to a circuit design for a system formed on a semiconductor chip, the circuit design including at least one circuit core. The method includes providing in the circuit design at least one field programmable gate array (FPGA) core, extracting an incremental change to the circuit design by comparing a new resister-transfer-level (RTL) design and an old RTL design for the system, synthesizing the incremental change into a netlist for the at least one FPGA core, generating new metal layer interconnections so as to provide an input and an output for the at least one FPGA core in accordance with the incremental change, and programming the at least one FPGA core in accordance with the netlist. The at least one FPGA core is provided in an otherwise unused area of the chip.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and system for implementing incremental change to a circuit design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
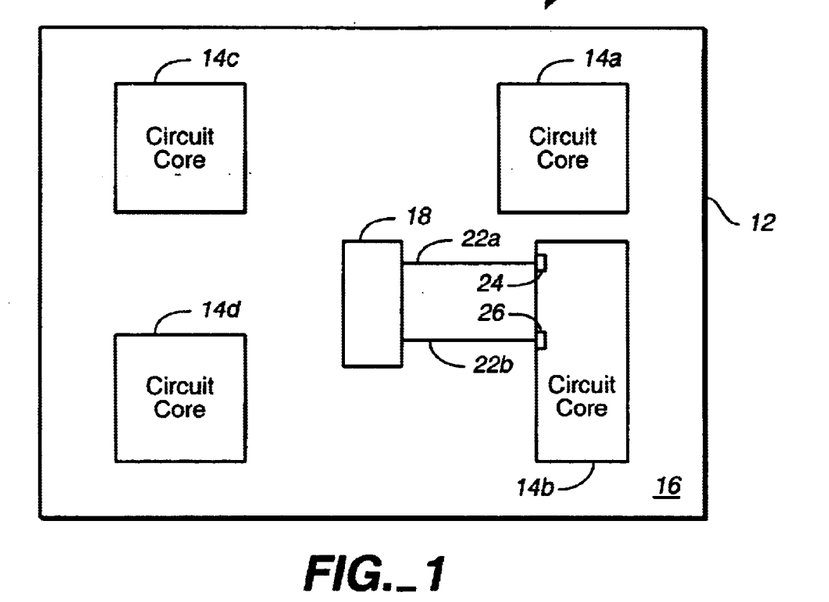
FIG. 1 is a diagram schematically illustrating a system formed on a semiconductor chip (system-on-a-chip) in accordance with one embodiment of the present invention.
Figure 2:
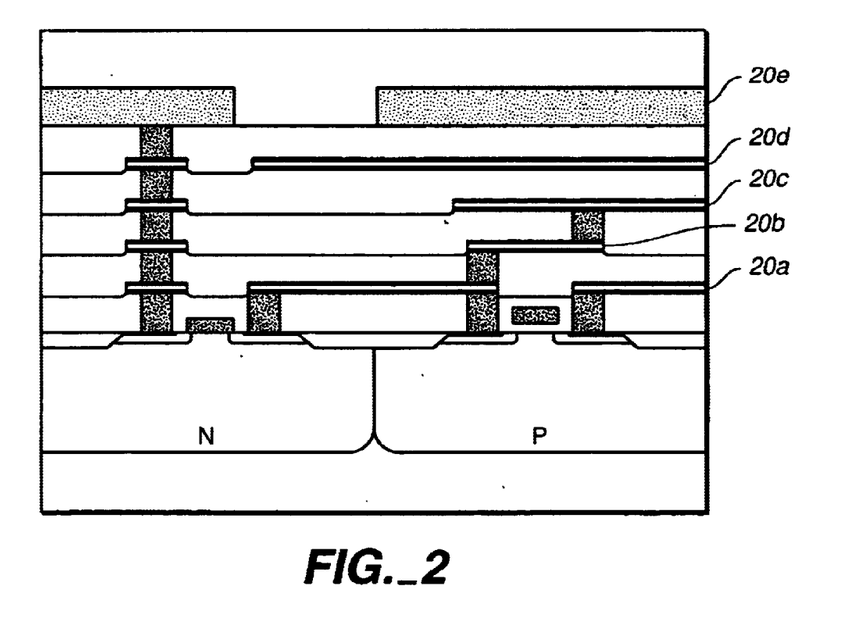
FIG. 2 is a diagram schematically illustrates a cross-sectional view of a typical integrated circuit (IC) chip where metal layers are formed on a semiconductor substrate.

FIG. 1 schematically illustrates a system 10 formed on a semiconductor chip 12 in accordance with one embodiment of the present invention. As shown in FIG. 1, the system 10 includes at least one circuit core 14 (14a, 14b, 14c, and 14d) provided on a semiconductor substrate 16, at least one field programmable gate array (FPGA) core 18, and metal layers formed on the semiconductor substrate 16 (only metal layer interconnections 22a and 22b are shown in FIG. 1). The system 10 formed on a chip may include an application specific integrated circuit (ASIC) and/or an application specific standard product (ASSP). FIG. 2 schematically illustrates a cross-sectional view of a typical integrated circuit (IC) chip where metal layers are formed on a semiconductor substrate. In FIG. 2, five metal layers 20a, 20b, 20c, 20d, and 20e are shown. However, the number of the metal layers is not limited to five.

Figure 3:
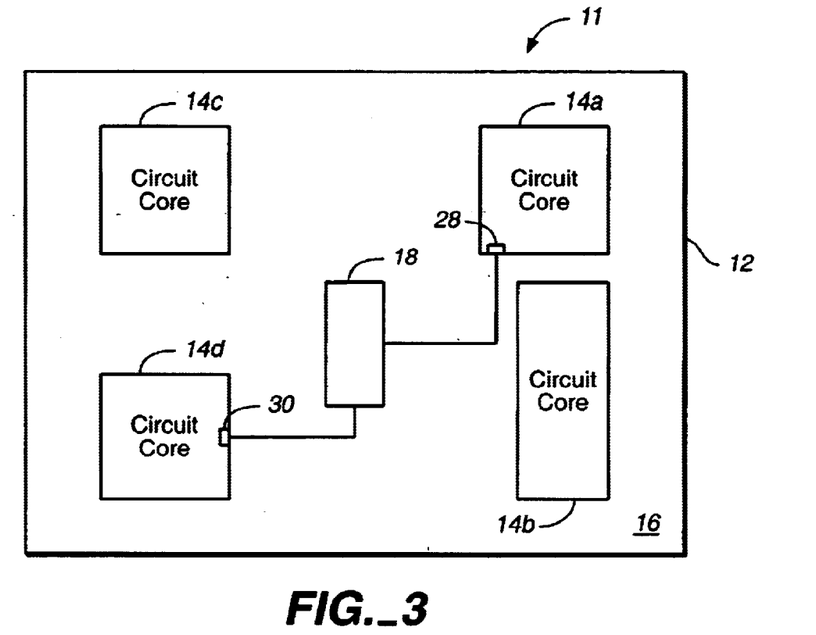
FIG. 3 is a diagram schematically illustrating a system-on-a-chip in accordance with one embodiment of the present invention.

The circuit design of the system 10 includes an incremental change to an old circuit design, for example, a revision or fix to an existing design. The incremental change may include a difference between a new resister-transfer-level (RTL) design and an old RTL design for the system 10. As shown in FIG. 1, the FPGA core 18 is provided in a gap between circuit cores 14, i.e., an otherwise unused area of the substrate 16. The FPGA core 18 is programmed and configured so as to reflect the incremental change to the old circuit design. For example, the FPGA core 18 implements a netlist synthesized from the incremental change to the RTL design. The metal layers has interconnections 22a and 22b providing an input 24 and an output 26 for the FPGA core 18 in accordance with the incremental change. As shown in FIG. 1, for example, when the incremental change is only associated with the function of the circuit core 14b, both of the input 24 and output 26 may be provided from the circuit core 14b. FIG. 3 shows a system 11 in which the incremental change is associated with two or more circuit cores. In such a case, as shown in FIG. 3, an input 28 and an output 30 for the FPGA core 18 may be provided by the corresponding circuit cores 14a and 14d, for example.

Figure 4:
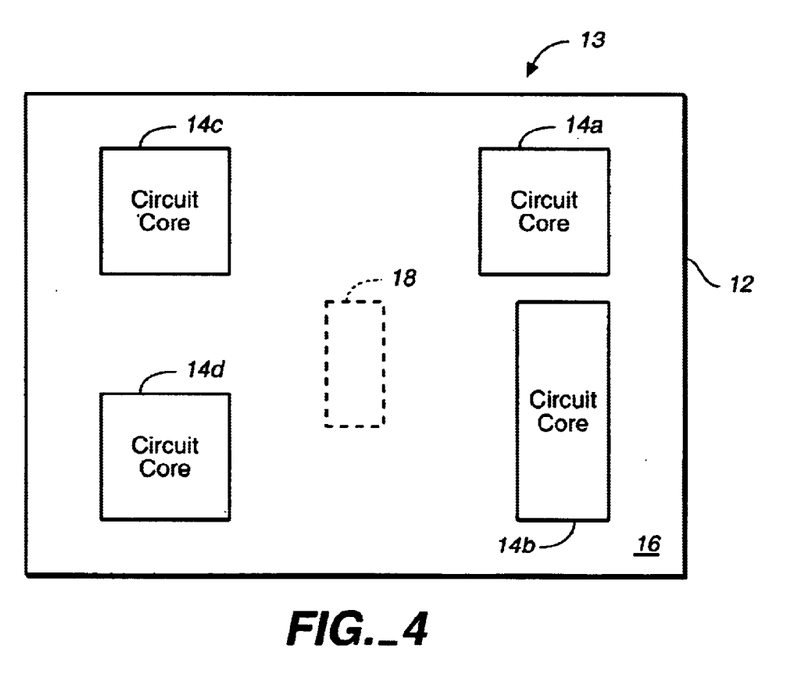
FIG. 4 is a diagram schematically illustrating, for comparison, a system-on-a-chip before the incremental change is incorporated.

For comparison, FIG. 4 schematically illustrates a system 13 before the incremental change is incorporated. The system 13 with the old circuit design has at least one circuit core 14 (14a, 14b, 14c and 14d) placed on a semiconductor substrate 16. The system 13 also includes the FPGA core 18. However, although the FPGA core 18 is embedded for the future use, it is neither programmed nor used in the system 13. Thus, the metal layer of the system 13 does not have interconnections to the FPGA core 18. It should be noted the existing interconnections for circuit cores 14 are not shown in the drawings for the reason of simplicity.

Figure 5:
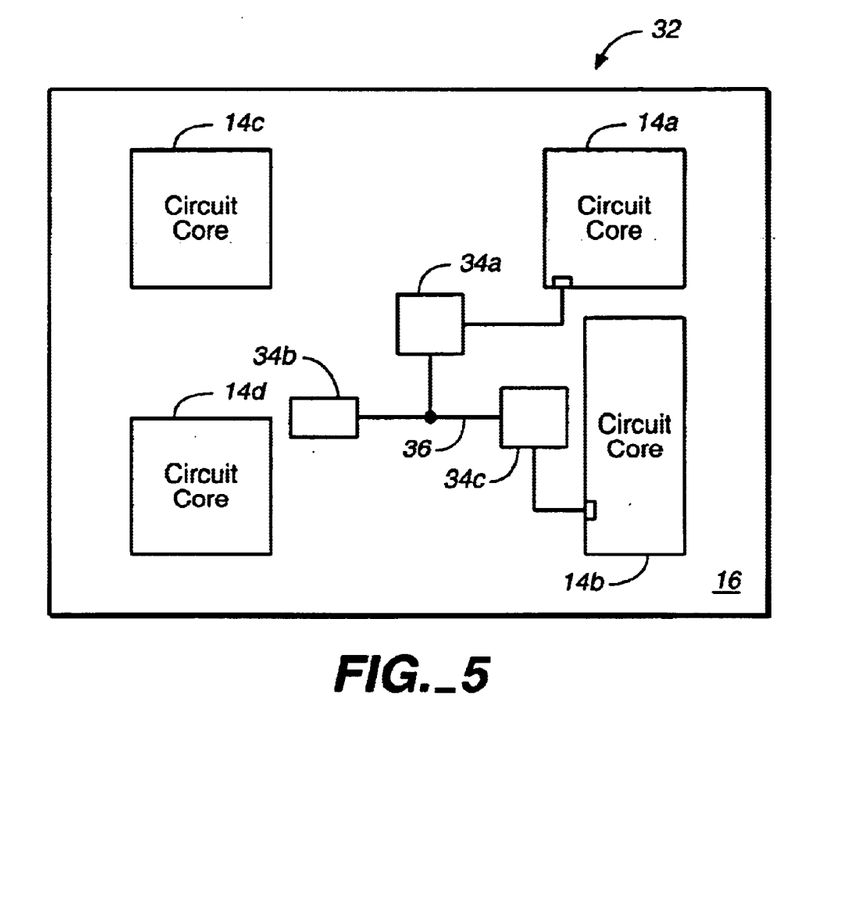
FIG. 5 is a diagram schematically illustrating a system-on-a-chip with distributed FPGA cores in accordance with one embodiment of the present invention.

FIG. 5 schematically illustrates a system 32 in accordance with one embodiment of the present invention. The system 32 includes a plurality of FPGA cores 34a, 34b, and 34c distributed in a free area of the substrate 16. As shown in FIG. 5, the distributed FPGA core 34a, 34b, and 34c are interconnected by a bus 36 so as to effectively make up a larger FPGA core. The interconnection or link can be done using an AMBA slave, or using a dedicated I/O optimized to the need.

Figure 6:
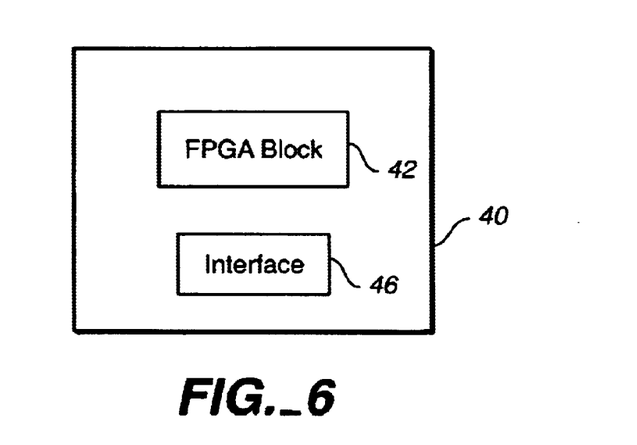
FIG. 6 is a diagram schematically illustrating an FPGA core in accordance with one embodiment of the present invention.
Figure 7:
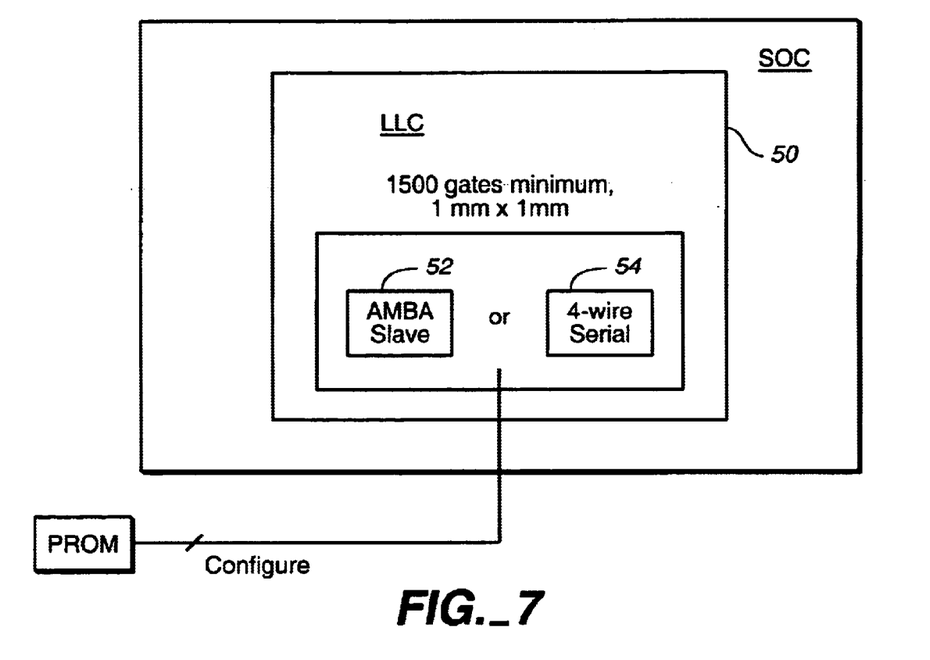
FIG. 7 is a diagram schematically illustrating a typical configuration of an LLC using AMBA slave (with 8-bit AMBA bus) or a 4-wire serial port.

FIG. 6 schematically illustrates an FPGA core 40 in accordance with one embodiment of the present invention. The FPGA core 40 includes an FPGA block 42 and an input/output (I/O) interface 46 adapted to interface other circuit core(s) or circuitry. The FPGA core 40 may be an embedded programmable logic core such as a LiquidLogic Core (LLC), available from LSI Logic corporation, Milpitas, Calif. The smallest size of the LLC currently available in 0.8 $\mu$m-gate length (drawn) process technology is 1 mm×1 mm, which supports 1,500 gates that can be configured through a 4-signal serial interface or an AMBA slave. FIG. 7 schematically illustrates typical configuration of an LLC 50 using AMBA slave 52 (with 8-bit AMBA bus) or a 4-wire serial port 54.

Figure 8:
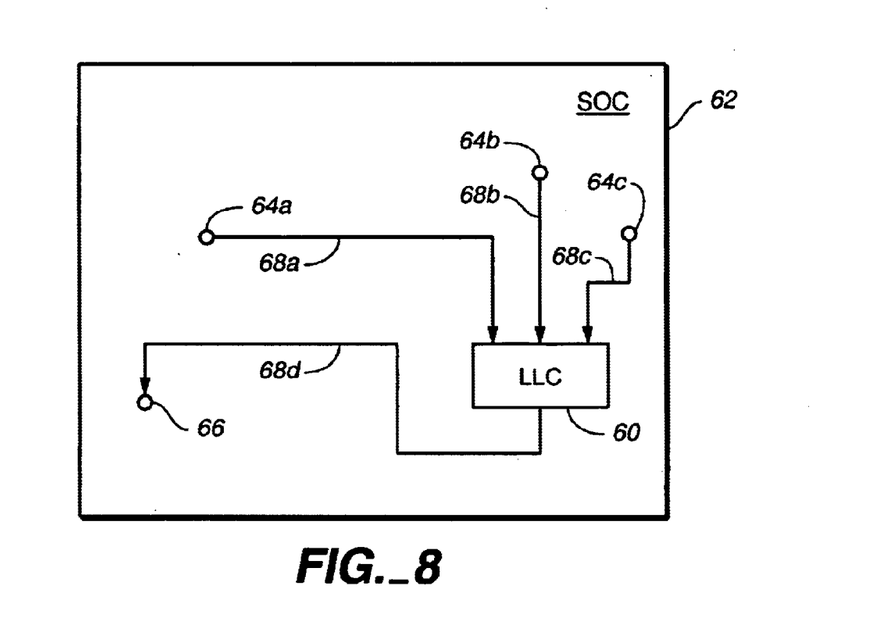
FIG. 8 is a diagram schematically illustrates an LLC placed in a free area of a system-on-a-chip substrate.

The LLC is small enough to fit in typically available gaps (free areas) in a standard cell layout. For example, the smallest LLC size of 1 mm×1 mm (with 1,500 gates) requires 33 units. Gaps in a cell layout are of all sizes (and are also measured in units) and there can be tens of sites that support the minimum site size of 33 units. In a standard cell layout, some of the candidate sites may be blocked from placement for signal routing. However, the LLC area can accommodate other signal routing with decoupled timing closure. Typically, most of multi-million gate ASICs have free areas supporting 15,000 gates of programmable logic without increasing the die size. The 33-unit or larger areas are typically available around the I/O and the larger embedded memories. FIG. 8 schematically illustrates an LLC 60 placed in such a free area of a system-on-a-chip substrate 62. The input nodes 64a, 64b, and 64c and an output node 66 are connected to the LLC 60. The input nodes 64a, 64b, and 64c may be from one or more circuit cores (not shown in FIG. 8). Metal layers provide interconnections 68a, 68b, 68c, and 68d between the input/output nodes 64a, 64b, 64c, and 66 and the LLC 60, so that signals form the input nodes 64a, 64b, and 64c are bring into the LLC 60, and the output signal of the LLC 60 is coupled to the output node 66.

Figure 9:
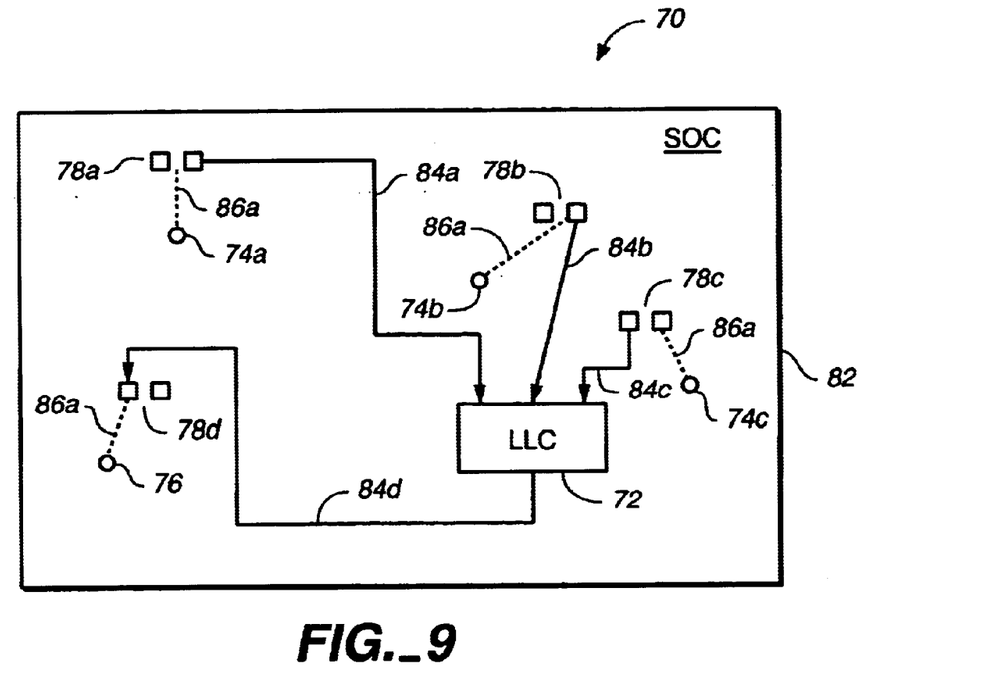
FIG. 9 is a diagram schematically illustrating a system-on-a-chip having an FPGA core with backfill gates in accordance with one embodiment of the present invention.

FIG. 9 schematically illustrates a system 70 in accordance with one embodiment of the present invention. The system 70 includes an FPGA core (of LLC) 72, input nodes 74a, 74b, and 74c, an output node 76 for the FPGA core 72, and backfill gates 78a, 78b, 7c, and 78d. The input nodes 74a, 74b, and 74c, and the output nodes 76 are typically from one or more circuit cores (not shown), and the backfill gates 78a, 78b, 78c, and 78d are disposed in an otherwise unused area of the semiconductor substrate 82. As shown in FIG. 9, backfill gates 78a, 78b, 7c, and 78d can be used to buffer signals from the circuit cores to the FPGA core 72 and vice versa That is, the backfill gates 78a, 78b, and 78c provide input buffers for the signals input to the FPGA core 72, and the backfill gates 78d provide an output buffer for signals from the FPGA core 72. The metal layers provide interconnections 84a, 84b, 84c, and 84d from input/output nodes 74a, 74b, 74c, and 74d to the backfill gates 78a, 78b, 78c, and 78d, and the interconnections from the backfill gates 78a, 78b, 78c, and 78d to the FPGA core 72, respectively. It should be noted that the number of the input and output nodes are not limited to the number as shown in FIG. 9, and may be any number as required by the change made to the netlist.

Providing input and/or output buffers is typically useful, for example, in the following situation. The FPGA core 72 may be placed in a large gap area, such as near the I/O, and the circuit core(s) to/from which the signals are connected could be a lengthy distance away from the FGPA core 72 due to the circuit core layout. However, multi-unit sites, from which backfill gates are built, are typically available throughout the substrate 82, likely in areas much closer to the circuit core(s) from which the signals are input to the FPGA core 72, or to which the signals from the FPGA core 72 are supplied. In such as case, buffering the signals with nearby backfill gates would be useful.

The backfill gates can also be used with the distributed FPGA cores such as shown in FIG. 5. In addition, the backfill gates added to the netlist are not only used for buffering signals to and from the FPGA core, but they may also be used in the conventional manner as described above.

Furthermore, additional logic functions can also be implemented using the backfill gates. In accordance with one embodiment of the present invention, combined with the backfill gates implementing logic functions, the FPGA core (or LLC) can be reconfigurable not only for fixes or revision of functions, but also for different verification tasks. For example, using backfill gates, an AND function may be implemented for a bus to the input of the FPGA core for bus monitoring or bus protocol verification. Other verification tasks, such as firmware code coverage, and signal monitoring and processing for debug can also be implemented.

For example, the FPGA core can be used with a logic analyzer core embedded in a chip design, for example, ChipScope™ ILA (Integrated Logic Analyzer), available from Xilinx®, San Jose, Calif. A logic analyzer core typically provides trigger and trace capture, and is used for on-chip debugging and verification. Using an FPGA core with such a logic core analyzer enables more complex triggering functions, and implements conditional trace to condense the trace size. Such a technique would be to have the logic analyzer signals monitoring internal FPGA core node signals that provide other signal processing results or conditions for trace.

For example, leveraging ChipScope ILA's access to 256 signals, these can then be fed to an FPGA core (as well as current feed to trace) on field selection basis. This would expand the available signals to the FPGA core, enabling more verification, debug, functions or fix tasks to be pro-cessed. If re-defined, the logic analyzer signals can also be inputs to logic, with the FPGA core outputs driving these signals. In some cases, fixes can be implemented without changing metal layer interconnections.

An FPGA core (or LLC) or FPGA cores can also be used for simulation testbench. That is, the simulation testbench can be made synthesizable to fit in the FPGA core(s) in the same manner as changes to the circuit design (RTL) are synthesized into the FPGA core(s). Module level and chip level simulations are typically run. These testbenches can be made synthesizable and the synthesis result can be manifested in the FPGA core(s). Available probe points of the logic analyzer core (such as ChipScope ILA) can be made available to the testbench FPGA core(s). The feed of the vectors to the module under test can be done with metal layer changes, or the logic analyzer core may have inputs so defined, or typically a bus can be used to interface to a module. If a bus is used, as the FPGA core has an AMBA slave, this FPGA core can be read from for stimulus input to the module under test. It should be noted that the AMBA slave can be used for gathering results from the module under test as well. Having the same testbench in simulation and embedded silicon verification is advantageous, since tools and formats are re-used, and results are shared. If more monitoring of happenings in the "silicon run" is needed, the section of time can be captured, with the bitstream segment, the register values, the clocking, etc. and such monitored results are transferred to simulation for more detailed analysis. The silicon runs are an extension of simulation.

Furthermore, fault coverage can be improved before tape-out or after tapeout using FPGA cores (LLCs). In the case of fault coverage before tapeout, a tool is used to identify key nodes to be covered, then the nodes are routed to the FPGA core, and the FPGA core is programmed to provide a method to read the nodes out either through the scan chain or AMBA slave or other methods. The nodes read out then provide more fault coverage. The FPGA core is configured at wafer sort and final test, typically taking 50 $\mu$sec/1500 gate core. In the case of fault coverage after tapeout, the same process is used except routing is done using the incremental metal approach. The RTL is edited (i.e., new RTL is created to assign interconnections to the FPGA core(s) via direct connections to the FPGA core inputs or via backfill gates connecting to source node and driving the FPGA core inputs) and then synthesis is used to generate the gate netlist. The RTL for the FPGA core is handled separately. The smallest FPGA core supports 128 I/Os. The number of nodes to cover can determine the input requirement to the FPGA core, and therefore it determines which FPGA core should be used, 128 I/O-LLC or larger LLC(s). A typical chip can have multi-thousands of unobserved nodes that would be candidates for additional coverage.

Figure 10:
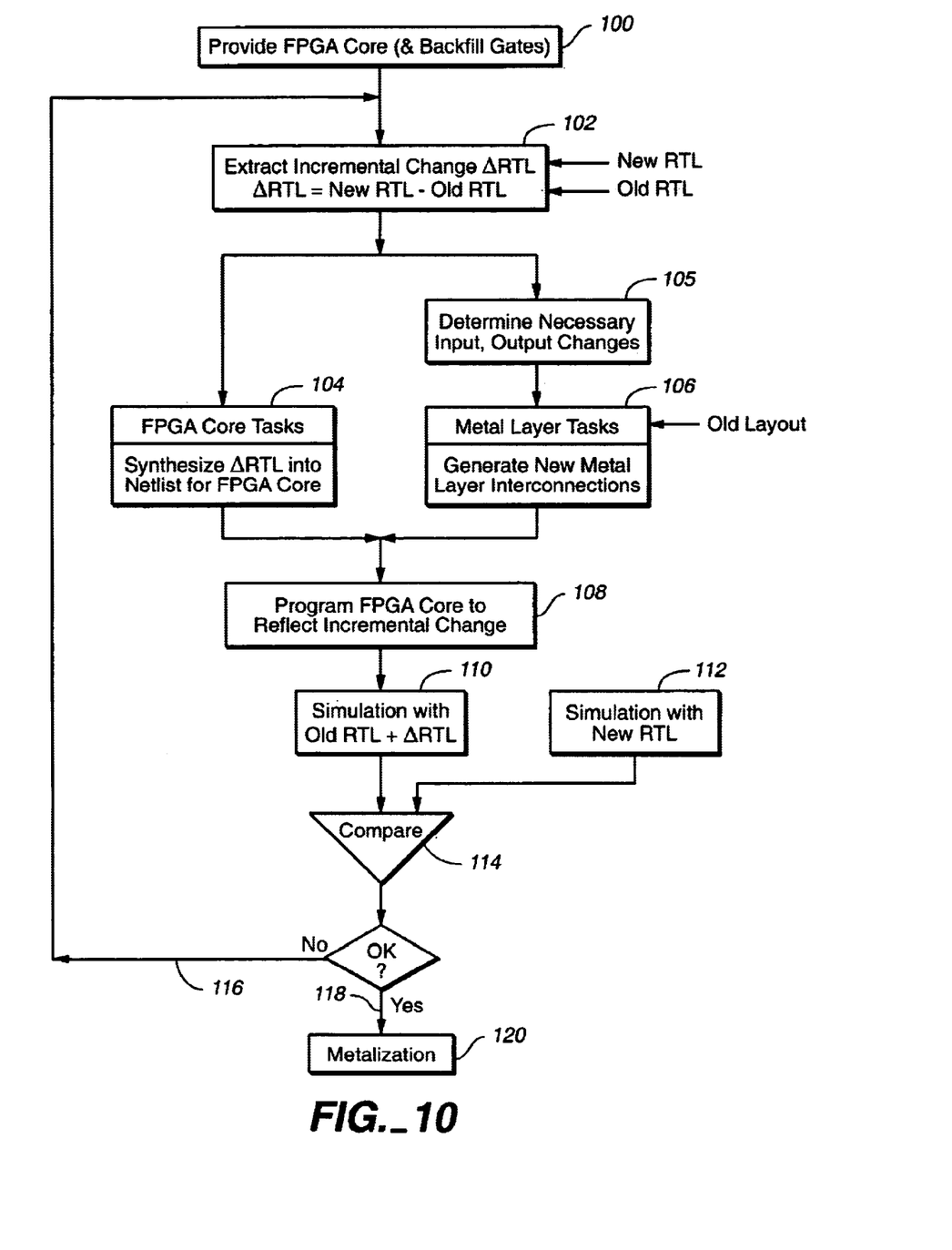
FIG. 10 is a process flow diagram schematically illustrating a method for implementing a change to a circuit design

FIG. 10 schematically illustrates a process flow of a method for implementing a change to a circuit design for a system formed on a semiconductor chip (system-on-a-chip), in accordance with one embodiment of the present invention. Such a system-on-a-chip may include an ASIC design and/or ASSP design. The method may be performed using a tool (software program) so as to automate the circuit design and/or re-design process described below.

The circuit design includes at least one circuit core, for example, implementing one or more specific user functions. The circuit design is provided with at least one field programmable gate array (FPGA) core (100). The FPGA core is not used in the original circuit design, and thus the FPGA core is placed in a free area (unused area) of the original core layout. In addition, the circuit design may also be provided with backfill gates, which are to be disposed in an otherwise unused area in the chip layout (100).

When a fix or update/revision becomes necessary for the circuit design, an incremental change to the circuit design (ΔRTL) is extracted by comparing a new RTL design and the old RTL design for the system (102). The incremental change ΔRTL is synthesized into a netlist for the FPGA core (104). Also, by examining the old RTL synthesis, input(s) and output(s) necessary to be add or deleted in order to implement the incremental change are determined (105). A list of such necessary input/output changes may be generated. Based on the determined input/output changes to the old circuit layout, new metal layer interconnections are generated so as to provide an input (or inputs) and an output (or outputs) for the FPGA core (106). When a plurality of FPGA cores are embedded in the circuit design, a suitable one may be selected depending on location and size of the FGPA core, metal layer connectivity, and availability and location of the optional backfill gates (if used together). Also, two or more FPGA core may be selected to meet a size requirement and/or other requirements. As shown in FIG. 10, the FPGA core tasks and the metal layer tasks are combined to implement the incremental change to the existing circuit design. The FPGA core is then programmed in accordance with the netlist reflecting the incremental change (108).

Figure 11:
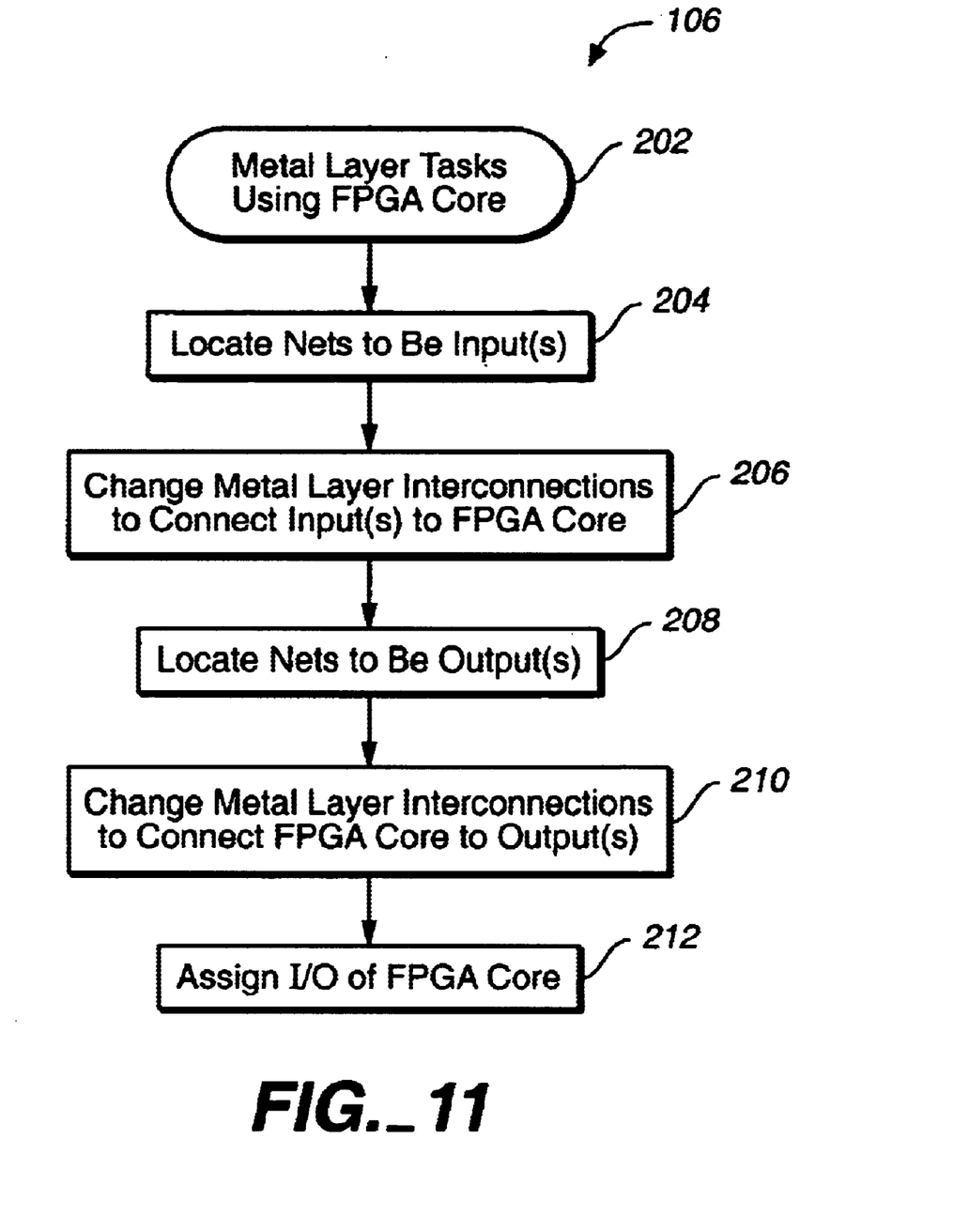
FIG. 11 is a process flow diagram schematically illustrating the metal layer tasks without backfill gates in accordance with one embodiment of the present invention.

FIG. 11 schematically illustrates the metal layer tasks 106 in accordance with one embodiment of the present invention, in which the incremental change is implemented using the FPGA core(s) without backfill gates (202). First, nets to be an input (or inputs) for inputting an input signal to the FPGA core (typically nets of a circuit core of the old circuit design) are located (204), and the old metal layer interconnections (i.e., those in the old layout) are changed so as to connect the input to the FPGA core (206). Nets to be an output (or outputs) for receiving an output signal from the FPGA core are also located (208). Such output nets may be in the same circuit core as that for the input nets, or in a different circuit core, depending on the fix or change to be made. The old metal interconnections are also changed so as to connect the FPGA core to the output (210), and then an input/output interface of the FPGA core is assigned to the input and the output (212). It should be noted that, depending on the incremental change, two or more inputs and/or two or more outputs may be located, and also two or more FPGA cores may be used. One or more metal layers may be cut and/or added so as to bring the input and output to the FPGA core(s).

Figure 12:
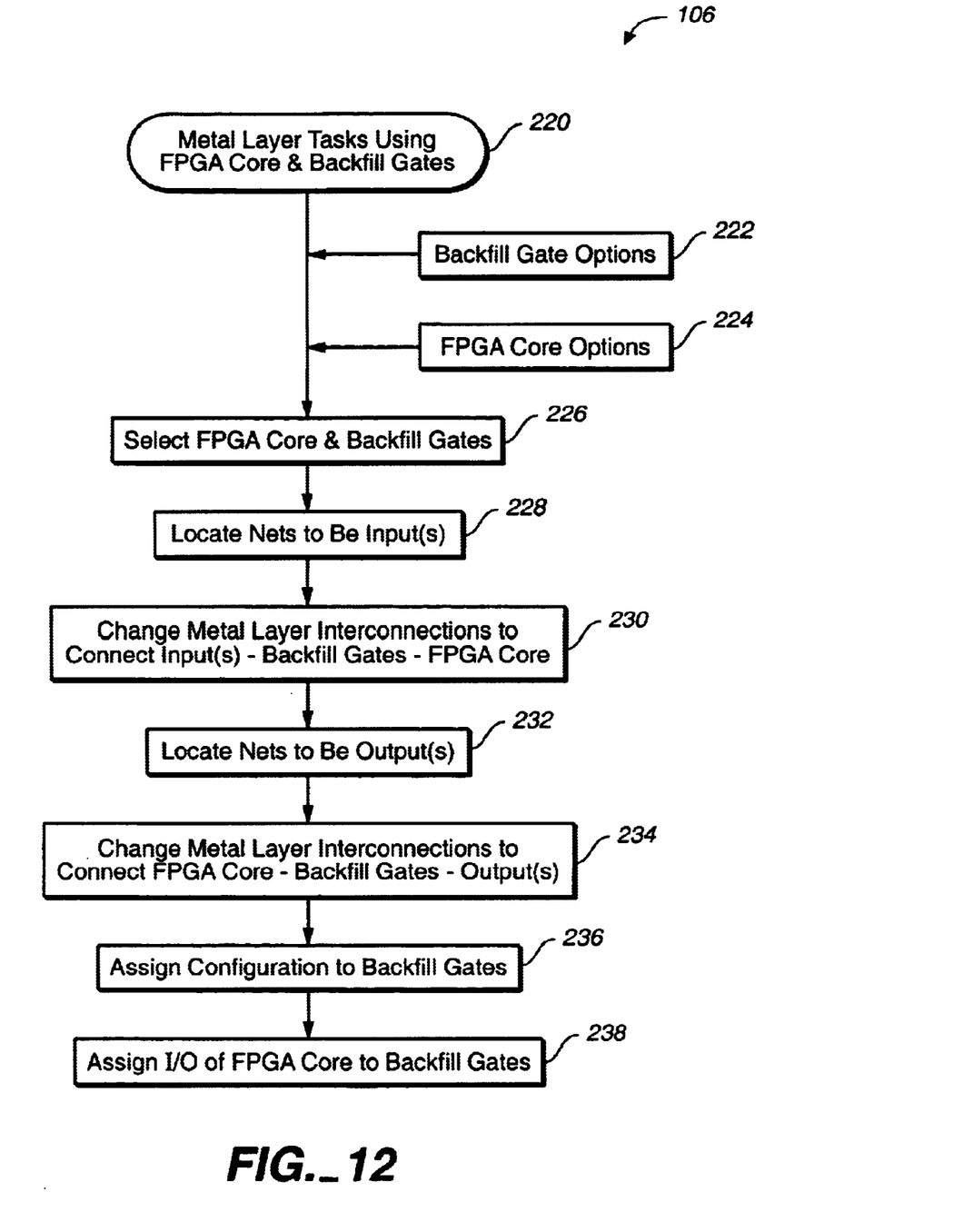
FIG. 12 is a process flow diagram schematically illustrating the metal layer tasks with backfill gates in accordance with one embodiment of the present invention.

FIG. 12 schematically illustrates the metal layer tasks 106 in accordance with another embodiment of the present invention, in which the incremental change is implemented using the FPGA core(s) and backfill gates (220). In this case, as describe above, backfill gates have been provided in the circuit design so as to be disposed in an otherwise unused area of the chip. Before conducting the metal layer tasks, availability of such backfill gates and their locations are examined and backfill gate options for the incremental change are determined (222). Also, availability, size, location, and/or connectivity of the FPGA cores are examined to find FPGA core options for each backfill gate option (224). Based on the option information for the incremental change, at least one FPGA core and first and second backfill gates are selected (226). For example, the first backfill gates provide an input buffer for the FPGA core, and the second backfill gates provide an output buffer for the FPGA core. Next, nets to be an input for inputting an input signal to the first backfill gates are located (228). Metal interconnections are changed so as to connect the input to the first backfill gates, and to connect the first backfill gates to the FPGA core (230). Nets to be an output for receiving an output signal from the second backfill gates are located (232). The metal interconnections are also changed so as to connect the FPGA core to the second backfill gates, and to connect the second backfill gates to the output (234). Similarly to the previous embodiment, depending on the incremental change, two or more inputs and/or two or more outputs may be located, and also two or more FPGA core may be used. One or more metal layers may be cut and/or added to bring the input(s) and output(s) to the FPGA core(s) through the first and second backfill gates.

Next, a first configuration is assigned to the first backfill gates so as to provide the input signal to the at least one FPGA core, and a second configuration to the second backfill gates is assigned so as to provide the output signal from the at least one FPGA core to the output (236). According to the assigned configuration, the backfill gates may be NAND, FF, or other logic gates to feed the signal to and from the FPGA core. An input/output interface of the FPGA core is assigned to the first backfill gates and the second backfill gates (238). It should be noted that the backfill gates can be assigned various gate functions, depending on the changes and/or additional functions implemented by the FPGA core.

After the metal layer tasks are completed, the FPGA core is programmed so as to reflect the synthesized incremental change (108) (FIG. 10), as mentioned above. Then, a simulation is run for the circuit design with the incremental change, i.e., the old RTL design plus the extracted incremental change ΔRTL (110). Another simulation for the new RTL design is also run (112), and the simulation results are compared (114). If the comparison is not satisfactory (116), the "FPGA core with metal layer implementation" is reviewed and necessary revision and/or debugging is performed. For example, the new metal layer interconnections are revised based on the comparison. When the comparison is satisfactory (118), a metalization process is performed for the new metal layers using the existing foundry wafer so as to produce the new (physical) metal layer interconnections reflecting the incremental change (120). It should be noted that the substrate of the existing foundry wafer has the semiconductor structure the same as that for the system with the old RTL design. Finally, the FPGA core embedded in each chip is configured in accordance with the programming.

As describe above, in accordance with one embodiment of the present invention, a fix can be implemented using at least one FPGA core by interconnecting the signals to the FPGA core (using incremental changes to RTL, corresponding netlist, and metal layer interconnections), and configuring the FPGA core to implement the fix. Backfill gates are not necessary, but they can be used with FPGA core(s). There is not the constraint of a few gate level circuits to resolve a fix as is the case for the a conventional backfill gate approach, but 1500 gates or more of an FPGA core (or FPGA cores) can be used to fix or revise the circuit. Even after the metalization is done, the FPGA core can be configured differently in the board, providing more flexibility. Producing a fix from the RTL level is significantly more productive than the conventional backfill gates approach.

The present invention enables backfill of FPGA cores (typically for free in terms of area) and use of FPGA cores for fixes, for verification, or for function changes. In accordance with one embodiment of the present invention, a tool is used to automate implementing the changes to RTL (fix)

into the FPGA core with metalization (i.e., metal layer changes). The technology also allows fixes, more fault coverage, functions, or verification to be added at the RTL level, using at least one FPGA core having 1500 gates or more. This is a reasonable size for synthesis. By combining a free FPGA core with metal interconnections (metalization) capability and a tool automating the flow of re-design process, a broad variety of logic changes can be made, pre or post silicon. This technology saves a great amount of money and time in changing/revising a given circuit design since there is no need to prepare new masks and to go through semiconductor process all over.

while embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for implementing a change to a circuit design for a system formed on a semiconductor chip, the system including at least one circuit core implementing an existing circuit design, said method comprising:
   providing in the system at least one field programmable gate array (FPGA) core in addition to said at least one circuit core;
   extracting an incremental change to the circuit design by comparing a new resister-transfer-level (RTL) design and an existing RTL design for the system;
   synthesizing said incremental change into a netlist;
   generating new metal layer interconnections so as to provide an input and an output for said at least one FPGA core in accordance with said incremental change; and
   programming said at least one FPGA core in accordance with the netlist, the programmed FPGA core and the new metal interconnections implementing the incremental change.

2. A method for implementing a chance to a circuit design for a system formed on a semiconductor chip, the circuit design including at least one circuit core, said method comprising:
   providing in the circuit design at least one field programmable gate array (FPGA) core, said at least one FPGA core being provided in an otherwise unused area of the chip;
   extracting an incremental change to the circuit design by comparing a new resister-transfer-level (RTL) design and an old RTL design for the system;
   synthesizing said incremental change into a netlist for said at least one FPGA core;
   generating new metal layer interconnections so as to provide an input and an output for said at least one FPGA core in accordance with said incremental change; and
   programming said at least one FPGA core in accordance with the netlist.

3. A method according to claim 2, wherein a plurality of FPGA cores are provided in an otherwise unused area of the chip, said plurality of FPGA cores being interconnected by a bus.

4. A method according to claim 2, wherein said generating new metal interconnections includes:
   locating nets to be an input for inputting an input signal to said at least one FPGA core;
   changing metal layer interconnections so as to connect said input to said at least one FPGA core;
   locating nets to be an output for receiving an output signal from said at least one FPGA core;
   changing metal layer interconnections so as to connect said at least one FPGA core to said output; and
   assigning an input/output interface of said FPGA core to said input and said output.

5. A method according to claim 2, further comprising:
   providing in the circuit design backfill gates to be disposed in an otherwise unused area of the chip; and
   selecting first backfill gates and second backfill gates for said at least one FPGA core based on said incremental change, said first backfill gates providing an input buffer for said at least one FPGA core, said second backfill gates providing an output buffer for said at least one FPGA core.

6. A method according to claim 5, wherein said generating new metal interconnections includes:
   locating nets to be an input for inputting an input signal to said first backfill gates;
   changing metal interconnections so as to connect said input to said first backfill gates, and to connect said first backfill gates to said at least one FPGA core;
   locating nets to be an output for receiving an output signal from said second backfill gates;
   changing metal interconnections so as to connect said at least one FPGA core to said second backfill gates, and to connect said second backfill gates to said output;
   assigning a first configuration to said first backfill gates so as to provide said input signal to said at least one FPGA core;
   assigning a second configuration to said second backfill gates so as to provide said output signal from said at least one FPGA core to said output; and
   assigning an input/output interface of said FPGA core to said first backfill gates and said second backfill gates.

7. A method according to claim 2, further comprising:
   running a first simulation with a system having the new RTL design;
   running a second simulation with a system having the old RTL design with said incremental change;
   comparing results of the first simulation and the second simulation; and
   revising, if necessary, the new metal layer interconnections based on said comparing.

8. A method according to claim 2, further comprising:
   performing a metalization process for the new metal layers on a wafer, thereby forming said new metal layer interconnections on the wafer, the wafer including a substrate having a same semiconductor structure as a substrate adapted to a system having the old RTL design.

9. A method according to claim 8, further comprising:
   configuring said at least one FPGA core embedded in each chip in accordance with said programming.

10. A method according to claim 2, wherein said circuit design of a system formed on a chip includes at least one of an application specific integrated circuit (ASIC) design and an application specific standard product (ASSP) design.

11. A system formed on a semiconductor chip, a circuit design for said system including an incremental change from an old circuit design, said system comprising:
    at least one circuit core provided on a semiconductor substrate, said at least one circuit core implementing the old circuit design;

at least one field programmable gate array (FPGA) core, said at least one FPGA core being programmed and configured to reflect the incremental change; and metal layers formed on the semiconductor substrate, said metal layers having interconnections providing an input and an output for said at least one FPGA core in accordance with the incremental change.

12. A system formed on a semiconductor chip, a circuit design for said system including an incremental change from an old circuit design, said system comprising:

at least one circuit core provided on a semiconductor substrate;

at least one field programmable gate array (FPGA) core provided in an otherwise unused area of the chip, said at least one FPGA core being programmed and configured to reflect the incremental change; and metal layers formed on the semiconductor substrate, said metal layers having interconnections providing an input and an output for said at least one FPGA core in accordance with the incremental change.

13. A system according to claim 12, wherein a plurality of FPGA cores are provided in an otherwise unused area of the chip, said plurality of FPGA cores being interconnected by a bus.

14. A system according to claim 12, wherein said FPGA core includes an input-output interface, said metal layer interconnections including:

a first connection between said input and said input/output interface; and a second connection between said output and said input/output interface.

15. A system according to claim 12, further comprising:

backfill gates disposed in an otherwise unused area of the semiconductor substrate, first backfill gates and second backfill gates being selected to be used with said at least one FPGA core.

16. A system according to claim 15, wherein said first backfill gates provide an input buffer for said at least one FPGA, and said second backfill gates provides an output buffer for said at least one FPGA core.

17. A system according to claim 15, wherein said FPGA core includes an input-output interface, said metal layer interconnections including:

a first connection from said input through said first backfill gates to said input/output interface; and a second connection from said input/output interface through said second backfill gates to said output.

18. A system according to claim 12, wherein said incremental change includes a difference between a new resister-transfer-level (RTL) design and an old RTL design for said system.

19. A system according to claim 18, wherein said at least one FPGA core implements a netlist synthesized from said incremental change.

20. A system according to claim 12, wherein said system formed on a chip includes at least one of an application specific integrated circuit (ASIC) and an application specific standard product (ASSP).

21. An apparatus for implementing a change to a circuit design for a system formed on a semiconductor chip, the circuit design including at least one circuit core, said apparatus comprising:

means for providing in the circuit design at least one field programmable gate array (FPGA) core to be placed in an unused area of the chip;

means for extracting an incremental change to the circuit design by comparing a new resister-transfer-level (RTL) design and an old RTL design for the system;

means for synthesizing said incremental change into a netlist for said at least one FPGA core;

means for generating new metal layer interconnections so as to provide an input and an output for said at least one FPGA core in accordance with said incremental change; and means for programming said at least one FPGA core in accordance with the netlist.

22. An apparatus according to claim 21, wherein said at least one FPGA core is provided in an otherwise unused area of the chip.

23. An apparatus according to claim 21, wherein a plurality of FPGA cores are provided in an otherwise unused area of the chip, said plurality of FPGA cores being interconnected by a bus.

24. An apparatus according to claim 21, wherein said means for generating new metal interconnections includes:

means for locating nets to be an input for inputting an input signal to said at least one FPGA core;

means for changing metal layer interconnections so as to connect said input to said at least one FPGA core;

means for locating nets to be an output for receiving an output signal from said at least one FPGA core;

means for changing metal layer interconnections so as to connect said at least one FPGA core to said output; and means for assigning an input/output interface of said FPGA core to said input and said output.

25. An apparatus according to claim 21, further comprising:

means for providing in the circuit design backfill gates to be disposed in an otherwise unused area of the chip; and means for selecting first backfill gates and second backfill gates for said at least one FPGA core based on said incremental change, said first backfill gates providing an input buffer for said at least one FPGA, said second backfill gates providing an output buffer for said at least one FPGA core.

26. An apparatus according to claim 25, wherein said means for generating new metal interconnections includes:

means for locating nets to be an input for inputting an input signal to said first backfill gates;

means for changing metal interconnections so as to connect said input to said first backfill gates, and to connect said first backfill gates to said at least one FPGA core;

means for locating nets to be an output for receiving an output signal from said second backfill gates;

means for changing metal interconnections so as to connect said at least one FPGA core to said second backfill gates, and to connect said second backfill gates to said output;

means for assigning a first configuration to said first backfill gates so as to provide said input signal to said at least one FPGA core;

means for assigning a second configuration to said second backfill gates so as to provide said output signal from said at least one FPGA core to said output; and means for assigning an input/output interface of said FPGA core to said first backfill gates and said second backfill gates.

27. An apparatus according to claim 21, further comprising:

means for running a first simulation with a system having the new RTL design;

means for running a second simulation with a system having the old RTL design with said incremental change;

means for comparing results of the first simulation and the second simulation; and means for revising, if necessary, the new metal layer interconnections based on said comparing.

28. An apparatus according to claim 21, further comprising:

means for performing a metalization process for the new metal layers on a wafer, thereby forming said new metal layer interconnections on the wafer, the wafer having a same semiconductor structure as a wafer for a system having the old RTL design.

29. An apparatus according to claim 28, further comprising:

means for configuring said at least one FPGA core embedded in each chip in accordance with said programming.

30. An apparatus according to claim 21, wherein said circuit design of a system formed on a chip includes at least one of an application specific integrated circuit (ASIC) design and an application specific standard product (ASSP) design.

31. A program storage device readable by a machine, tangibly embodying a program of instructions executable by the machine to perform a method for implementing a change to a circuit design for a system formed on a semiconductor chip, the circuit design including at least one circuit core, said method comprising:

providing in the circuit design at least one field programmable gate array (FPGA) core to be placed in an unused area of the chip;

extracting an incremental change to the circuit design by comparing a new resister-transfer-level (RTL) design and an old RTL design for the system;

synthesizing said incremental change into a netlist for said at least one FPGA core;

generating new metal layer interconnections so as to provide an input and an output for said at least one FPGA core in accordance with said incremental change; and programming said at least one FPGA core in accordance with the netlist.

32. A program storage device according to claim 31, wherein said generating new metal interconnections includes:

locating nets to be an input for inputting an input signal to said at least one FPGA core;

changing metal layer interconnections so as to connect said input to said at least one FPGA core;

locating nets to be an output for receiving an output signal from said at least one FPGA core;

changing metal layer interconnections so as to connect said at least one FPGA core to said output; and assigning an input/output interface of said FPGA core to said input and said output.

33. A program storage device according to claim 31, wherein said method further comprises:

providing in the circuit design backfill gates to be disposed in an otherwise unused area of the chip; and selecting first backfill gates and second backfill gates for said at least one FPGA core based on said incremental change, said first backfill gates providing an input buffer for said at least one FPGA, said second backfill gates providing an output buffer for said at least one FPGA core.

34. A program storage device according to claim 33, wherein said generating new metal interconnections includes:

locating nets to be an input for inputting an input signal to said first backfill gates;

changing metal interconnections so as to connect said input to said first backfill gates, and to connect said first backfill gates to said at least one FPGA core;

locating nets to be an output for receiving an output signal from said second backfill gates;

changing metal interconnections so as to connect said at least one FPGA core to said second backfill gates, and to connect said second backfill gates to said output;

assigning a first configuration to said first backfill gates so as to provide said input signal to said at least one FPGA core;

assigning a second configuration to said second backfill gates so as to provide said output signal from said at least one FPGA core to said output; and assigning an input/output interface of said FPGA core to said first backfill gates and said second backfill gates.

35. A program storage device according to claim 31, wherein said method further comprises:

running a first simulation with a system having the new RTL design;

running a second simulation with a system having the old RTL design with said incremental change;

comparing results of the first simulation and the second simulation; and revising, if necessary, the new metal layer interconnections based on said comparing.

* * * * *